United States Patent
Zhang et al.

(10) Patent No.: US 12,154,998 B1
(45) Date of Patent: Nov. 26, 2024

(54) PHOTOVOLTAIC MODULE

(71) Applicants: JINKO SOLAR CO., LTD., Jiangxi (CN); ZHEJIANG JINKO SOLAR CO., LTD., Zhejiang (CN)

(72) Inventors: Chunfeng Zhang, Jiangxi (CN); Yunfei Xie, Jiangxi (CN); Zhiqiu Guo, Jiangxi (CN); Wusong Tao, Jiangxi (CN)

(73) Assignees: JINKO SOLAR CO., LTD., Jiangxi (CN); ZHEJIANG JINKO SOLAR CO., LTD., Haining Zhejiang (CN)

( * ) Notice: Subject to any disclaimer, the term of this patent is extended or adjusted under 35 U.S.C. 154(b) by 0 days.

(21) Appl. No.: 18/471,431

(22) Filed: Sep. 21, 2023

(30) Foreign Application Priority Data

Jun. 25, 2023 (CN) .......................... 202310753089.8

(51) Int. Cl.
*H01L 31/048* (2014.01)
*H01L 31/05* (2014.01)

(52) U.S. Cl.
CPC ...... *H01L 31/0481* (2013.01); *H01L 31/0508* (2013.01)

(58) Field of Classification Search
CPC ........................... H01L 31/048–0481
See application file for complete search history.

(56) References Cited

U.S. PATENT DOCUMENTS

| | | | |
|---|---|---|---|
| 2012/0152323 A1 | 6/2012 | Perry et al. | |
| 2020/0243706 A1* | 7/2020 | Nakamura | H01L 31/048 |

FOREIGN PATENT DOCUMENTS

| | | | |
|---|---|---|---|
| CN | 210897310 U | 6/2020 | |
| CN | 111416008 A | 7/2020 | |
| CN | 211555904 U | 9/2020 | |
| CN | 214848646 U | 11/2021 | |
| CN | 115074039 A * | 9/2022 | ............... C09J 7/10 |
| CN | 218290791 U | 1/2023 | |
| CN | 115692526 A | 2/2023 | |
| CN | 218447934 U | 2/2023 | |
| CN | 116200131 A | 6/2023 | |
| JP | 2013125778 A | 6/2013 | |

(Continued)

OTHER PUBLICATIONS

English machine translation of Chen et al. (CN 115074039) published Sep. 20, 2022.*

(Continued)

*Primary Examiner* — Christina Chern
(74) *Attorney, Agent, or Firm* — USCH Law, PC (57) ABSTRACT

A photovoltaic module includes a first cover plate, a first adhesive film, a cell string, a second adhesive film and a second cover plate. The first cover plate has a first surface, facing the cell string and including a central area and an edge area surrounding the central area. The first adhesive film includes a first sub-adhesive film located on at least part of the edge area, and a second sub-adhesive film located on a surface of the first sub-adhesive film away from the first surface and having an orthographic projection on the first surface at least covering the central area and part of the edge area. Material of part of the first sub-adhesive film facing the cell string is the same as material of part of the second adhesive film facing the cell string, and material of part of the second sub-adhesive film facing the cell string is POE.

16 Claims, 4 Drawing Sheets

(56) References Cited

FOREIGN PATENT DOCUMENTS

| | | | | |
|---|---|---|---|---|
| JP | 2013187349 A | 9/2013 | | |
| JP | 2013537001 A | 9/2013 | | |
| JP | 2014013876 A | 1/2014 | | |
| JP | 2014135331 A | 7/2014 | | |
| JP | 2015119008 A | 6/2015 | | |
| JP | 2015192065 A | 11/2015 | | |
| JP | 2015195375 A | * 11/2015 | ........... | H01L 31/042 |
| JP | 2018174284 A | 11/2018 | | |
| JP | 2020177972 A | 10/2020 | | |
| JP | 2020203381 A | 12/2020 | | |
| KR | 20210027969 A | 3/2021 | | |
| WO | 2015182503 A1 | 12/2015 | | |

OTHER PUBLICATIONS

English machine translation of Ji et al. (CN 218290791) published Jan. 13, 2023.*
English machine translation of Oizumi et al. (JP 2015-195375) published Nov. 5, 2015.*
Jinko Solar Co., Ltd., et al., Extended European Search Report, EP 23198630.8, Mar. 27, 2024, 8 pgs.
Jinko Solar Co., Ltd., et al., KR First Office Action with English translation, KR 10-2023-0126672; Sep. 9, 2024, 14 pgs.

* cited by examiner

PHOTOVOLTAIC MODULE

CROSS REFERENCE TO RELATED APPLICATIONS

This application claims priority to Chinese Patent Application No. CN202310753089.8, entitled "PHOTOVOLTAIC MODULE," filed on Jun. 25, 2023, which is incorporated hereby by reference in its entirety.

TECHNICAL FIELD

The various embodiments described in this document relate in general to the technical field of solar cells, and in particular to a photovoltaic module.

BACKGROUND

Fossil energy may cause atmospheric pollution and has limited reserves, while solar energy has the advantage of clean, pollution-free, and abundant in resources. As a result, solar energy is gradually becoming a core clean energy alternative to fossil fuels. Due to the good photoelectric conversion efficiency, solar cells have become the development focus of clean energy utilization.

A photovoltaic module includes a cell string, an encapsulation film and a cover plate. In the process of preparing a photovoltaic module, multiple solar cells are usually connected in turn to form a cell string with a specific output power, and an adhesive film layer and a cover plate are sequentially stacked on both sides of the cell string, and then the photovoltaic module is formed by lamination molding.

However, an encapsulation film of current photovoltaic modules is prone to problems such as bubbles and even delamination during use, and the reliability of photovoltaic modules needs to be improved.

SUMMARY

A photovoltaic module is provided according to some embodiments of the present disclosure, which is at least beneficial to improving the performance and bonding strength of an edge area of an encapsulation film, reducing the probability of bubble generation or delamination of the encapsulation film, and improving the reliability of the photovoltaic module.

A photovoltaic module is provided according to some embodiments of the present disclosure. The photovoltaic module includes a first cover plate, a first adhesive film, a cell string, a second adhesive film and a second cover plate which are sequentially stacked. The first cover plate is located over a light receiving surface of the cell string. The first adhesive film includes a first sub-adhesive film and a second sub-adhesive film which are sequentially stacked. The first cover plate has a first surface facing the cell string, and the first surface includes a central area and an edge area surrounding the central area. The first sub-adhesive film is located on at least part of the edge area of the first surface, and the second sub-adhesive film is located on a surface of the first sub-adhesive film far away from the first surface, and an orthographic projection of the second sub-adhesive film on the first surface at least covers the central area and part of the edge area of the first surface. A material of the part of the first sub-adhesive film facing the second cover plate is the same as a material of the part of the second adhesive film facing the first cover plate, and a material of the part of the second sub-adhesive film facing the cell string is POE.

In some embodiments, the first surface is rectangular, and the edge area includes two opposite long edge areas and two opposite short edge areas. An area where the two opposite long edge areas and the two opposite short edge area overlap forms corner areas, and the first sub-adhesive film covers at least one corner area of the corner areas in the edge area of the first surface.

In some embodiments, the first sub-adhesive film covers at least two short edge areas in the edge area of the first surface.

In some embodiments, a width of the first sub-adhesive film is in a range of 10 mm to 70 mm in an extension direction of long sides of the two opposite long edge areas.

In some embodiments, in an extension direction of long sides of the two opposite long edge areas, a distance between an edge of the orthographic projection of the second sub-adhesive film on the first surface and an edge of the first surface is in a range of 10 mm to 20 mm.

In some embodiments, in an extension direction of long sides of the two opposite long edge areas, a width of an overlapping area of the orthographic projection of the first sub-adhesive film on the first surface and the orthographic projection of the second sub-adhesive film on the first surface is in a range of 5 mm to 12 mm.

In some embodiments, in an extension direction of long sides of the two opposite long edge areas, a distance between an edge of the cell string and an edge of the second sub adhesive film is in a range of 10 mm to 15 mm.

In some embodiments, a material of the part of the first sub-adhesive film facing the second cover plate includes one of EVA, PVB and POE.

In some embodiments, the second adhesive film includes a third sub-adhesive film and a fourth sub-adhesive film which are sequentially stacked, the second cover plate has a second surface facing the cell string, and the second surface includes a central area and an edge area surrounding the central area. The third sub-adhesive film is located on at least part of the edge area of the second surface, and the fourth sub-adhesive film is located on a surface of the third sub-adhesive film far away from the second surface. An orthographic projection of the first sub-adhesive film on the first cover plate and an orthographic projection of the third sub-adhesive film on the first cover plate at least partially overlap, and a material of the part of the third sub-adhesive film facing the first cover plate is the same as a material of the part of the first sub-adhesive film facing the second cover plate.

In some embodiments, the first sub-adhesive film includes a first adhesive film layer and a second adhesive film layer which are sequentially stacked, the first adhesive film layer faces the second cover plate, and a material of the first adhesive film layer is the same as a material of the part of the second adhesive film facing the first cover plate.

In some embodiments, the second adhesive film includes a third adhesive film layer and a fourth adhesive film layer which are sequentially stacked, the third adhesive film layer faces the first cover plate, and a material of the third adhesive film layer is the same as the material of the part of the first sub-adhesive film facing the second cover plate.

In some embodiments, the second sub-adhesive film includes a POE adhesive film, a PE adhesive film including a part of POE facing the cell string or a PEP adhesive film.

The technical solution provided by the embodiments of the present disclosure at least has the following advantages.

According to the photovoltaic module provided by the embodiments of the present disclosure, in the process of laying the adhesive film, the first sub-adhesive film located in at least part of the edge area is disposed on the first surface of the first cover plate adjacent to the light receiving surface of the cell string, and the material of the part of the first sub-adhesive film facing the second cover plate is the same as the material of the part of the second adhesive film facing the first cover plate, and on the surface of the first sub-adhesive film away from the first cover plate, the second sub-adhesive film is then stacked on the first surface of the first cover plate, and the orthographic projection of the second sub-adhesive film at least covers the center area and part of the edge area of the first surface, and the material of the part of the second sub-adhesive film facing the cell string is POE. The materials of the parts of the first sub-adhesive film and the second adhesive film facing each other are set to be the same material, so that the adhesive films located at the opposite sides of the cell string form contact interfaces of the same material in the edge area during the lamination process of the photovoltaic module, thereby improving the bonding strength of the encapsulation film formed after lamination in the edge area, and reducing the probability of edge delamination or degumming of photovoltaic modules. Besides, the part of the second sub-adhesive film facing the cell string is made of POE, which greatly reduces the Potential Induced degradation (PID) effect of the photovoltaic module and improves the reliability and stability of the photovoltaic module.

BRIEF DESCRIPTION OF THE DRAWINGS

One or more embodiments are illustrated by figures in the accompanying drawings, and these illustrative descriptions do not constitute limitations on the embodiments, unless otherwise specified, the figures in the drawings do not constitute scale limitations.

DETAILED DESCRIPTION OF THE EMBODIMENTS

At present, in the preparation process of photovoltaic modules, adhesive film layers are usually laid on the opposite sides of the cell string respectively, thus forming a structure in which a cover plate, an adhesive film, a cell string, an adhesive film and a back plate are sequentially stacked. Then, the cover plate, the cell string and the back plate are laminated in sequence and an encapsulation film which is located between the cover plate and the back plate and covers the cell string is formed by lamination molding. The encapsulation film is usually formed by laminating the upper and lower layers of adhesive film. At present, the commonly used adhesive films are classified into two types, one is ethylene-vinyl acetate copolymer (EVA) adhesive film and the other is Poly Olefin Elastomer (POE) adhesive film. The EVA adhesive film has low cost, but high water absorption rate, and it is easy to be hydrolyzed to produce acetic acid, which causes serious PID effect in photovoltaic modules. The POE adhesive film has better anti-PID effect, but the cost is higher. Therefore, the encapsulation film is usually constructed by disposing the POE adhesive film on the front surface of the cell string and the EVA adhesive film on the back surface of the cell string.

After the POE adhesive film is laid on the front surface of the cell string and the EVA adhesive film is laid on the back surface of the cell string, the contact interface of the adhesive films in the edge area of the photovoltaic module in the lamination process is the contact interface of POE and EVA. Because POE and EVA are different materials, the adhesive strength of adhesive films in the edge area of photovoltaic module is limited. After hydrothermal aging, the encapsulation film in the edge area of photovoltaic module is prone to delamination or degumming, which affects the sealing and service life of photovoltaic module, leading to a decrease in its reliability.

According to the photovoltaic module provided by the embodiments of the present disclosure, in the process of laying adhesive films, a first sub-adhesive film is disposed on at least part of an edge area of a first surface of a first cover plate adjacent to a light receiving surface of a cell string, and the material of the part of the first sub-adhesive film facing a second cover plate is ensured to be the same as the material of the part of the second adhesive film facing the first cover plate, and on the surface of the first sub-adhesive film away from the first cover plate, the orthographic projection stacked on the first surface at least covers the second sub-adhesive film located in the center area and part of the edge area of the first surface, and the material of the part of the second sub-adhesive film facing the cell string is POE. The materials of the parts of the first sub-adhesive film and the second adhesive film facing each other are set to be the same material, so that the adhesive films located at the opposite sides of the cell string form contact interfaces of the same material in the edge area during the lamination process of the photovoltaic module, thereby improving the bonding strength of the encapsulation film formed after lamination in the edge area, reducing the probability of edge delamination or degumming of photovoltaic modules. Besides, the part of the second sub-adhesive film facing the cell string is made of POE, which greatly reduces the PID effect of the photovoltaic module and improves the reliability and stability of the photovoltaic module.

Hereinafter, the embodiments of the present disclosure are described in detail with reference to the accompanying drawings. However, those skilled in the art may understand that in various embodiments of the present disclosure, many technical details are put forward in order to make readers better understand the present disclosure. However, even without these technical details and various changes and modifications based on the following embodiments, the technical scheme claimed in the present disclosure can be realized.

Figure 1:
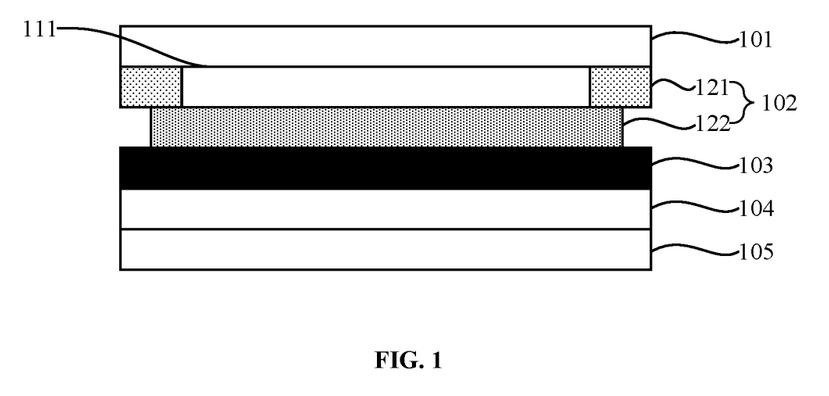
FIG. 1 is a schematic diagram of an overall structure of a photovoltaic module provided by an embodiment of the present disclosure.
Figure 2:
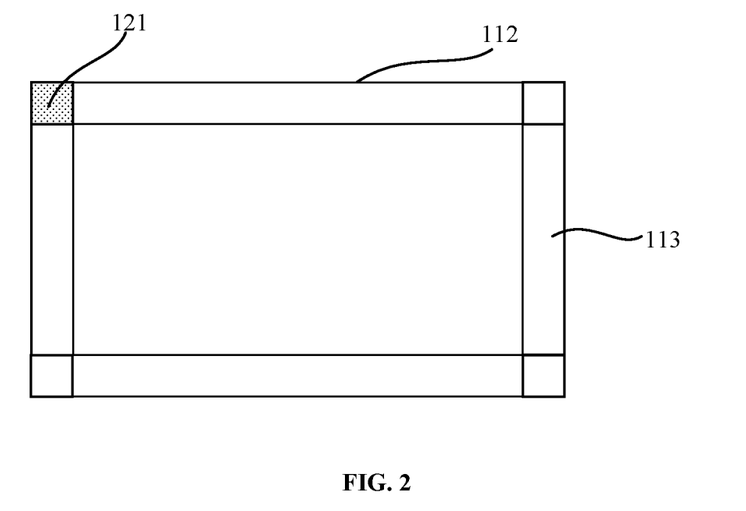
FIG. 2 is a schematic structural diagram of a first sub-adhesive film provided by an embodiment of the present disclosure.
Figure 3:
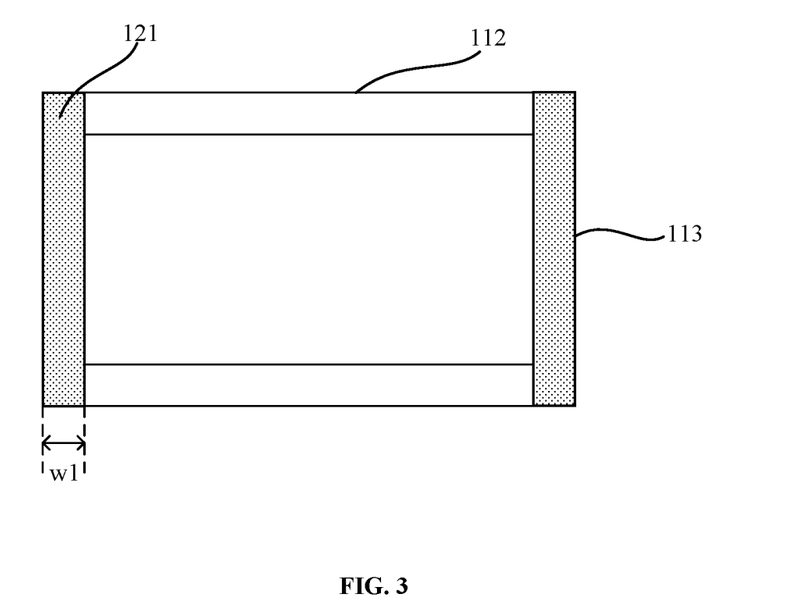
FIG. 3 is a schematic structural diagram of another first sub-adhesive film provided by an embodiment of the present disclosure.
Figure 4:
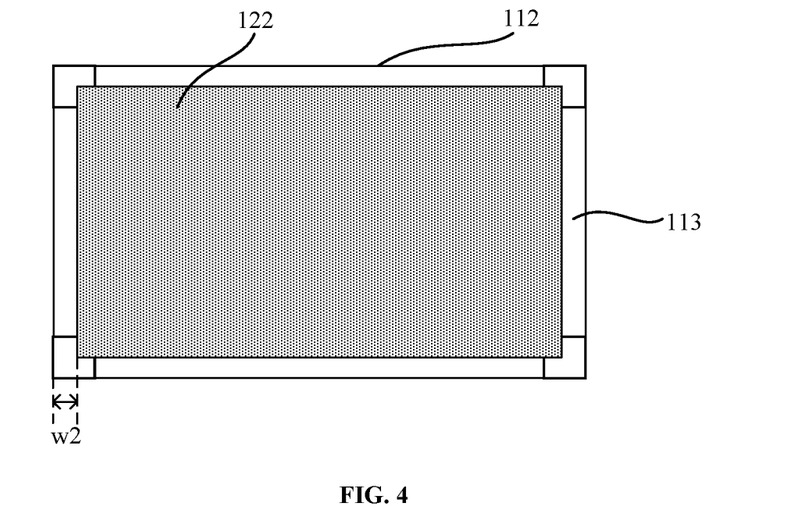
FIG. 4 is a schematic structural diagram of a second sub-adhesive film provided by an embodiment of the present disclosure.
Figure 5:
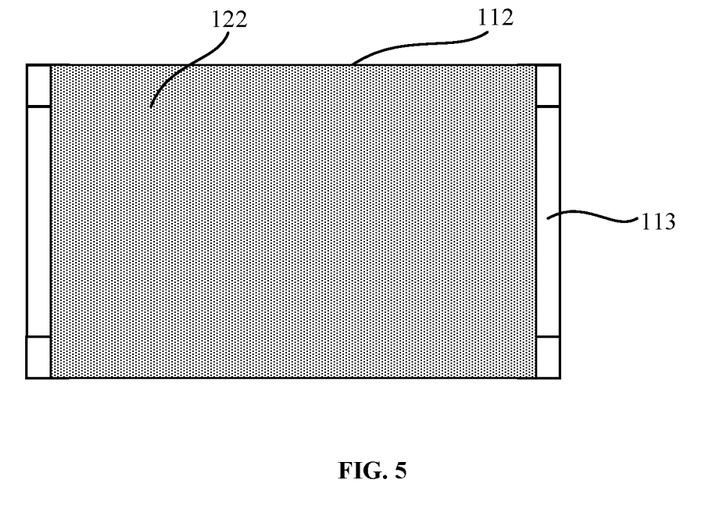
FIG. 5 is a schematic structural diagram of another second sub-adhesive film provided by an embodiment of the present disclosure.
Figure 6:
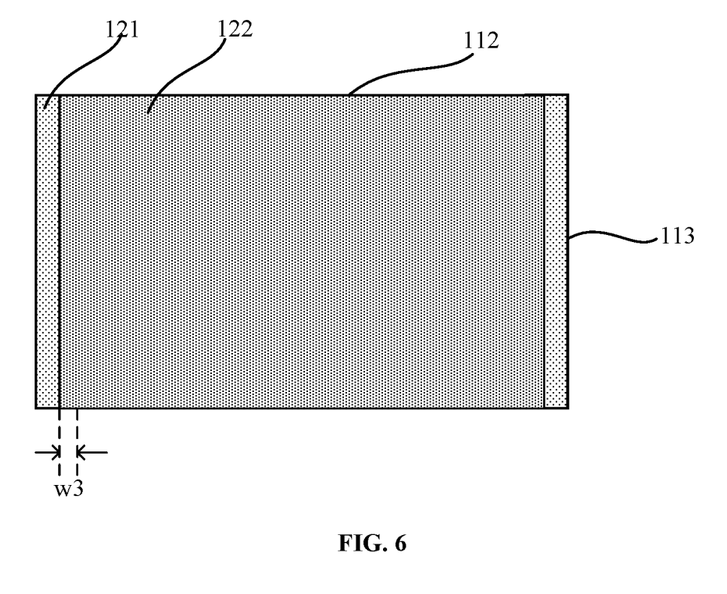
FIG. 6 is a schematic structural diagram of a first adhesive film provided by an embodiment of the present disclosure.
Figure 7:
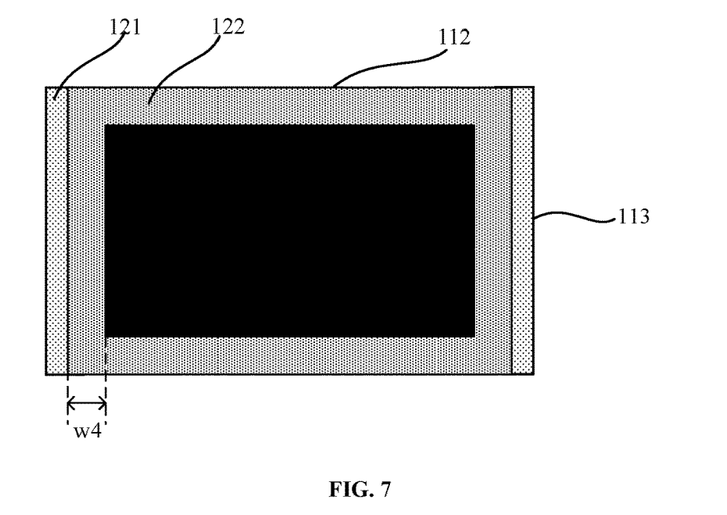
FIG. 7 is a schematic structural diagram of a cell string and a first adhesive film provided by an embodiment of the present disclosure.
Figure 8:
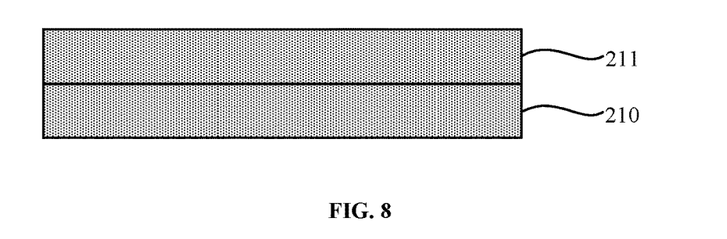
FIG. 8 is a sectional view of a first sub-adhesive film provided by an embodiment of the present disclosure.
Figure 9:
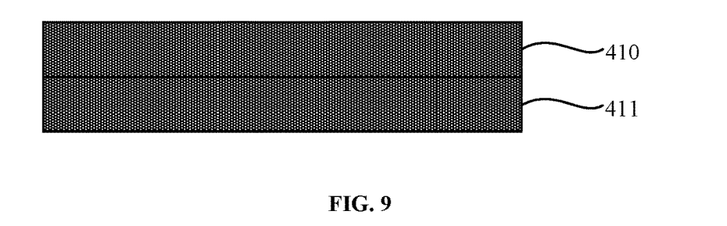
FIG. 9 is a sectional view of a second adhesive film provided by an embodiment of the present disclosure.
Figure 10:
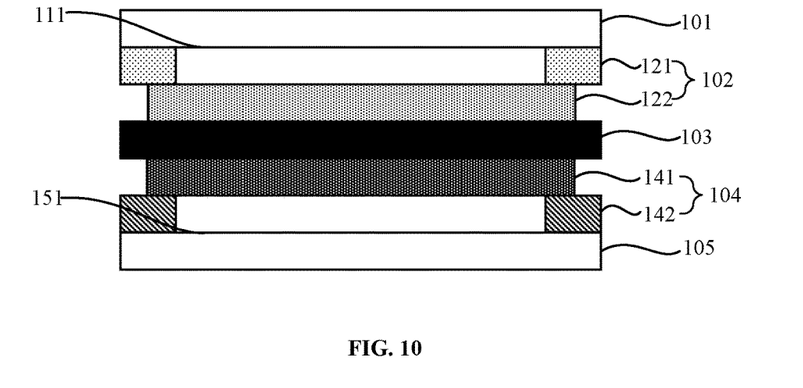
FIG. 10 is a schematic diagram of an overall structure of another photovoltaic module provided by an embodiment of the present disclosure.

A photovoltaic module is provided according to the embodiments of the present disclosure, referring to FIG. 1 to FIG. 10. FIG. 1 is a schematic diagram of an overall structure of a photovoltaic module provided by an embodiment of the present disclosure, FIG. 2 is a schematic diagram of an orthographic projection of a first sub-adhesive film on a first surface provided by an embodiment of the present disclosure, FIG. 3 is a schematic diagram of another orthographic projection of a first sub-adhesive film on a first surface provided by an embodiment of the present disclosure, FIG. 4 is a schematic diagram of an orthographic projection of a second sub-adhesive film on a first surface provided by an embodiment of the present disclosure, FIG. 5 is a schematic diagram of another orthographic projection of a second sub-adhesive film on a first surface provided by an embodiment of the present disclosure, FIG. 6 is a schematic diagram of a top view of a first adhesive film on a first surface provided by an embodiment of the present disclosure, FIG. 7 is a schematic diagram of a top view of a cell string and a first adhesive film on a first surface provided by an embodiment of the present disclosure, FIG. 8 is a sectional view of a first sub-adhesive film provided by an embodiment of the present disclosure, FIG. 9 is a sectional view of a second adhesive film provided by an embodiment of the present disclosure, and FIG. 10 is a schematic diagram of an overall structure of another photovoltaic module provided by an embodiment of the present disclosure.

A photovoltaic module includes a first cover plate 101, a first adhesive film 102, a cell string 103, a second adhesive film 104 and a second cover plate 105 which are sequentially stacked. The first cover plate 101 is adjacent to a light receiving surface of the cell string 103. The first adhesive film 102 includes a first sub-adhesive film 121 and a second sub-adhesive film 122 which are sequentially stacked. The first cover plate 101 has a first surface 111 facing the cell string 103, and the first surface includes a central area and an edge area surrounding the central area. The first sub-adhesive film 121 is located on at least part of the edge area of the first surface, the second sub-adhesive film 122 is located on a surface of the first sub-adhesive film 121 far away from the first surface, and an orthographic projection of the second sub-adhesive film 122 on the first surface covers the central area and at least part of the edge area of the first surface. A material of a part of the first sub-adhesive film 121 facing the second cover plate 105 is the same as a material of a part of the second adhesive film 104 facing the first cover plate 101, and a material of a part of the second sub-adhesive film 122 facing the cell string is POE.

It should be understood that the current photovoltaic module is a semi-finished photovoltaic module in the lamination molding process, and the finished photovoltaic module may only be formed after the lamination molding process. In the finished photovoltaic module, the first sub-adhesive film 121, the second sub-adhesive film 122 and the second adhesive film 104 may form an encapsulation film covering the cell string 103 and bonding the first cover plate 101 and the second cover plate 105. And an edge part of the encapsulation film is mainly formed by bonding the first sub-adhesive film 121 and the second adhesive film 104.

In the process of preparing photovoltaic module, the first sub-adhesive film 121 is laid on at least part of the edge area of the first surface 111 of the first cover plate 101, and then the second sub-adhesive film 122 is laid on the surface of the first sub-adhesive film 121 far away from the first cover plate 101, meanwhile the material of the part of the first sub-adhesive film 121 facing the second cover plate 105 is set as same as the material of the part of the second adhesive film 104 facing the first cover plate 101, so that the contact interfaces of the adhesive films on the opposite sides of the cell string 103 in the edge area of the photovoltaic module are the contact interfaces of the same material in the lamination process, thereby increasing the bonding strength between the adhesive films and reducing the probability of degumming or delamination of the encapsulation film formed by the adhesive films of the photovoltaic module during wet-heat aging. The part of the second sub-adhesive film 122 facing the cell string 103 is set to be made of POE, so that the anti-PID effect of the photovoltaic module can be improved, thereby improving the reliability of the photovoltaic module. The second sub-adhesive film 122 is set that its orthogonal projection on the first surface 111 covers the central area and at least part of the edge area of the first surface 111, so that the first sub-adhesive film 121 and the second sub-adhesive film 122 are partially overlapped to avoid the problem that the fluidity of POE of the second sub-adhesive film 122 is too high (which leads to glue overflow in the lamination process, and further leads to glue shortage of the encapsulation film), thereby improving the packaging effect of the photovoltaic module.

In some embodiments, the cell string 103 may include multiple cells, and each cell includes, but is not limited to, any one of a Passivated Emitter and Rear Cell (PERC cell), a Passivated emitter and rear totally-diffused (PERT) cell, a Tunnel Oxide Passivated Contact (TOPCon) cell, a Heterojunction Technology (HIT/HJT) cell and an interdigitated back contact (IBC) crystalline silicon solar cell.

In some embodiments, the cell may be a monocrystalline silicon solar cell, a polycrystalline silicon solar cell, an amorphous silicon solar cell or a multi-compound solar cell. The multi-compound solar cell may be specifically a cadmium sulfide solar cell, a gallium arsenide solar cell, a copper indium selenium solar cell or a perovskite solar cell.

In some embodiments, the cell may be a full-size cell or a sliced cell. The sliced cell refers to a cell formed by subjecting one complete full-slice cell to cutting process. The cutting process includes: Linear Spectral Clustering (LSC) process, and thermal stress cell separation (TMC) process. The advantage of forming a cell string with sliced cells is that the power generation of the cell string can be increased by reducing the resistance loss. According to Ohm's law, it can be known that the interconnection electric loss of the solar cell is positively proportional to the square of the electric current. Taking cutting the cell into two halves as an example, the electric current is reduced by half and the electric loss is also reduced to one quarter of the loss of the full-size cell.

It is worth mentioning that in the case of sliced cells, the sliced cell may be a two-slice cell, a three-slice cell, a four-slice cell or an eight-slice cell. The embodiments of the present disclosure do not limit the specific way of slicing.

In some embodiments, the first surface 111 is rectangular, and the edge area includes two opposite long edge areas 112 and two opposite short edge areas 113, and the areas where the long edge areas 112 and the short edge areas 113 overlap are corner areas. The first sub-adhesive film 121 covers at least one corner area of the edge area of the first surface 111.

In a case that the upper and lower cover plates of the photovoltaic module are cuboid cover plates with the same specifications, the first surface 111 of the first cover plate 101 is rectangular, and the first surface 111 includes two opposite long sides and two opposite short sides. Therefore, the edge area of the first surface 111 may be regarded as including two short edge areas 113 consistent with an extension direction of the short sides and two long edge areas 112 consistent with an extension direction of the long sides, and the area where the long edge areas 112 and the short edge areas 113 overlap are corner areas.

After the photovoltaic module is laminated, the part of the encapsulation film that is most prone to delamination or degumming after wet-heat aging is the part of the encapsulation film above the corner areas. Therefore, in the process of laying the first adhesive film 102, the first sub-adhesive film 121 attached to the first surface 111 may be laid on at least one corner area of the edge area of the first surface 111, and then the second sub-adhesive film 122 may be laid on the surface of the first sub-adhesive film 121 far away from the first surface 111 and be laid on the first surface 111. In case of laying only one corner area on the first sub-adhesive film 121, one of the two opposite first sub-adhesive films 121 does not exist in the schematic diagram of the overall structure of the photovoltaic module shown in FIG. 1. The second sub-adhesive film 122 is in contact with the surface of the first sub-adhesive film 121 far away from the first cover plate 101 and is in contact with the first surface.

Since the material of the part of the first sub-adhesive film 121 laid on the corner area facing the second cover plate 105 is the same as the material of the part of the second adhesive film 104 facing the first cover plate 101, in the lamination process, at least part of the contact interfaces of the adhesive films on both sides of the cell string 103 in the corner area are the contact interfaces of the same material, which effectively increases the bonding strength of the encapsulation film in the corner area, reduces the probability of degumming or delamination of the encapsulation film on the corner area where the first sub-adhesive film 121 is laid, and improves the reliability of photovoltaic modules.

It should be understood that the purpose of explaining the first surface 111 as a rectangle in the embodiment of the present disclosure is to facilitate understanding, in some embodiments, the first surface 111 may also be a circle, an ellipse or other polygons, which is not limited by the embodiment of the present disclosure. In a case that the first surface 111 is a geometric figure without corners, such as a circle or an ellipse, the first sub-adhesive film 121 covers the entire edge area of the first surface 111 around the central area.

In some embodiments, the first sub-adhesive film 121 may cover two corner areas respectively located on different short edge areas 113. In some embodiments, the first sub-adhesive film 121 may also cover all corner areas formed by overlapping the long edge areas 112 and the short edge areas 113.

In some embodiments, the first sub-adhesive film 121 covers at least two short edge areas 113 in the edge area of the first surface 111.

In the process of laying the first sub-adhesive film 121, for example, when laying the first sub-adhesive film 121 on at least one corner area in the edge area of the first surface 111, it is usually necessary to lay the first sub-adhesive film 121 in each corner area one by one, and the process is complicated. Moreover, due to the high fluidity of part of the POE material in the second sub-adhesive film 122, in order to avoid the problem that the encapsulation film is short of glue or there are bubbles due to glue overflow, the overall volume of the laid second sub-adhesive film 122 is large, which leads to the increase in the cost of photovoltaic modules.

Therefore, during the process of laying the first sub-adhesive film 121, it is possible to directly lay the first sub-adhesive film 121 that covers at least two short edge areas 113 in the edge area of the first surface 111. Because the first sub-adhesive film 121 covers at least two short edge areas 113 of the edge area of the first surface 111, the second sub-adhesive film 122 only contacts the surface of the first sub-adhesive film 121 far away from the first cover plate 101 before lamination, and does not contact the first surface 111. During the lamination process, the part of the second sub-adhesive film 122 whose orthographic projection on the first surface 111 is located in the central area may gradually flow into a pit surrounded by the first sub-adhesive film 121 and the first cover plate 101 after melting. The first sub-adhesive film 121 has a certain blocking ability to the POE material with high fluidity in the second sub-adhesive film 122, which can reduce the probability of the second sub-adhesive film 122 overflowing along an extension direction of the long side of the long edge area 112 and a total amount of the second sub-adhesive film 122 overflowing. Further, the probability of glue shortage or a large number of bubbles in the encapsulation film can be reduced, and the quality of the encapsulation film can be improved.

In addition, since the first sub-adhesive film 121 covers the two short edge areas 113 in the edge area of the first surface 111, in the lamination process, the contact interface of the adhesive film on the short edge area 113 is the contact interface between the same materials, and the bonding strength of the encapsulation film on the short edge area 113 can be greatly improved. Because the short edge areas 113 contains all corner areas, the probability of delamination or degumming of the encapsulation film at the edge corner of the laminated photovoltaic module after wet-heat aging can be greatly reduced, and the reliability of the photovoltaic module can be improved.

In addition, in the process of laying the first sub-adhesive film 121, in order to further improve the blocking to the overflow of the second sub-adhesive film 122, the first sub-adhesive film 121 may also be laid on the long edge area 112 of the first surface 111. For example, the first sub-adhesive film 121 covering at least some or all areas except corner areas is laid on any one long edge area 112, or the first sub-adhesive films 121 covering all areas except corner areas is laid on two long edge areas 112 respectively. By laying the first sub-adhesive film 121 on the long edge areas 112, the first sub-adhesive film 121 can prevent the overflow of POE material with high fluidity in the second sub-adhesive film 122 as much as possible during the lamination process, which reduces the probability of glue shortage or a large number of bubbles in the encapsulation film, and improves the reliability of photovoltaic modules.

In some embodiments, a width of the first sub-adhesive film 121 is in a range of 10 mm to 70 mm in the extension direction of the long side of the long edge area 112.

Referring to FIG. 3, in the extension direction of the long side of the long edge area 112, the width of the first sub-adhesive film 121 refers to the distance w1 between two opposite edges of the first sub-adhesive film 121 in the extension direction of the long side of the long edge area 112. The main function of the first sub-adhesive film 121 is to improve the bonding strength of adhesive films on both sides of the cell string 103 in the edge area during the lamination process.

Generally, in the extending direction of the long edge area 112, the distance between a cell located in an edge of the cell string 103 and the adjacent edge of the first cover plate 101 is small. In the case that the width of the first sub-adhesive film 121 is too large, the first sub-adhesive film 121 may directly contact the cell string 103 or flow onto the surface of the cell string 103 due to the fluidity of the adhesive film material during the lamination process, thereby greatly reducing the anti-PID effect ability of the photovoltaic module in the use process and the reliability of the photovoltaic module. In case that the width of the first sub-adhesive film 121 is too small, the overall volume of the first sub-adhesive film 121 is also small. In the lamination process, due to the strong fluidity of the POE material in the second sub-adhesive film 122, the flowing POE material may extrude all or part of the first sub-adhesive film 121 between the first cover plate 101 and the second cover plate 105. As a result, in the lamination process, the contact interface between the adhesive films on both sides of the cell string 103 in the edge area is the interface where different materials come into contact, which cannot effectively improve the bonding strength between the adhesive films.

Therefore, in the process of laying the first sub-adhesive film 121, the width of the laid first sub-adhesive film 121 in the extension direction of the long side of the long edge area 112 may be set within the range of 10 mm to 70 mm, for example, the width of the first sub-adhesive film 121 is set to 11 mm, 12.5 mm, 15 mm, 20 mm, 25 mm, 32.5 mm, 35 mm, 45 mm, 50 mm, 60 mm or 65 mm, etc. By setting the width of the first sub-adhesive film 121 within an appropriate range, it is possible to avoid contact between the first sub-adhesive film 121 and the light receiving surface of the cell string 103, which ensures that what is in contact with the light receiving surface of the cell string 103 is the part of POE material in the second sub-adhesive film 122, so that the photovoltaic module has strong anti-PID effect, and this configuration can also reduce the influence of POE material overflow in the second sub-adhesive film 122 on the bonding strength of the film in the edge area of the photovoltaic module, improve the bonding strength of the edge area of the encapsulation film formed by lamination, and reduce the probability of degumming of encapsulation films at the edge areas and corners of photovoltaic modules during wet-heat aging.

It is worth mentioning that when the first sub-adhesive film 121 covers two short edge areas 113, the widths of the first sub-adhesive films 121 located on the two opposite short edge areas 113 may be the same or different. In the case where the first sub-adhesive film 121 covers at least two corner areas, the width of the first sub-adhesive film 121 on corner areas may be the same or different.

In some embodiments, the distance between the edge of the orthogonal projection of the second sub-adhesive film 122 on the first surface 111 and the adjacent edge of the first surface 111 is in a range of 10 mm to 20 mm in the extension direction of the long side of the long edge area 112. FIG. 4 is a schematic view of the orthogonal projection of the second sub-adhesive film 122 on the first surface 111.

In the extension direction of the long side of the long edge area 112, the distance between the edge of the orthographic projection of the second sub-adhesive film 122 on the first surface 111 and the adjacent edge of the first surface 111 refers to: the distance w2 between two adjacent edges, one of the two adjacent edges being an edge of the first surface 111 and the other of the two adjacent edges being an edge, in the orthographic projection of the second sub-adhesive film 122 on the first surface 111, adjacent to the edge of the first surface 111 in the extension direction of the long side of the long edge area 112. The main function of the second sub-adhesive film 122 is to bond the cell string 103 and the first cover plate 101, and to ensure the anti-PID effect of the photovoltaic module.

In the extension direction of the long side of the long edge area 112, if the distance between the edge of the orthogonal projection of the second sub-adhesive film 122 on the first surface 111 and the adjacent edge of the first surface 111 is too large, the ratio of the area of the orthogonal projection of the second sub-adhesive film 122 on the first surface 111 to the area of the first surface 111 is too small. In order to ensure the anti-PID effect of the photovoltaic module, the cell string 103 needs to contact with the part of POE material in the second sub-adhesive film 122. Therefore, the area of the orthographic projection of the cell string 103 on the first surface 111 is less than or equal to the area of the orthographic projection of the second sub-adhesive film 122 on the first surface 111. In case that the ratio of the area of the orthogonal projection of the second sub-adhesive film 122 on the first surface 111 to the area of the first surface 111 is relatively small, the ratio of the area of the light receiving surface of the cell string 103 to the area of the light receiving surface of the photovoltaic module is also small, and the photoelectric conversion efficiency of the photovoltaic module is low. If the distance between the edge of the orthogonal projection of the second sub-adhesive film 122 on the first surface 111 and the adjacent edge of the first surface 111 is too small, the overlapping area between the second sub-adhesive film 122 and the first sub-adhesive film 121 is too large, so that the second sub-adhesive film 122 easily overflows to the area between the second adhesive film 104 and the first sub-adhesive film 121. In case that the part of the first sub-adhesive film 121 facing the second adhesive film 104 is not made of POE, a large contact interface of adhesive films of different materials is formed in the edge area of photovoltaic module, which affects the bonding strength of adhesive films in the edge area of photovoltaic module.

Therefore, in the process of laying the second sub-adhesive film 122, the distance between the edge of the orthogonal projection of the second sub-adhesive film 122 on the first surface 111 and the adjacent edge of the first surface 111 in the extension direction of the long side of the long edge area 112 may be set within the range of 10 mm to 20 mm, for example, set at 10.5 mm, 11 mm, 12 mm, 12.5 mm, 13.5 mm, 15 mm, 16.5 mm, 17.5 mm, or 19 mm. By setting the distance between the edge of the second sub-adhesive film 122 and the edge of the photovoltaic module in an appropriate range, the ratio of the area of the light receiving surface of the cell string 103 to the area of the light receiving surface of the photovoltaic module is ensured to be large, which improves the absorption rate of the cell string 103 to the light irradiated on the photovoltaic module and the photoelectric conversion efficiency of the photovoltaic module, avoids the formation of a large-area contact interface of different adhesive films with low bonding strength in the edge area of the photovoltaic module, and improves the bonding strength and reliability among the adhesive films in the edge area of the photovoltaic module.

In addition, referring to FIG. 5, the orthogonal projection of the second sub-adhesive film 122 on the first surface 111 may not only cover at least part of the long edge area 112 except the corner area, but also cover all the remaining areas of the long edge area 112 except the corner area, which increases the film volume of the second sub-adhesive film 122 and the coverage area of the orthogonal projection of the second sub-adhesive film 122 on the first surface 111, and avoids the problem of glue shortage or bubbles caused by glue overflow in the lamination process.

In some embodiments, the width of the overlapping area of the orthogonal projection of the first sub-adhesive film 121 on the first surface 111 and the orthogonal projection of the second sub-adhesive film 122 on the first surface 111 is in a range of 5 mm to 12 mm in the extension direction of the long side of the long edge area 112. FIG. 6 is a top view of the first sub-adhesive film 121 and the second sub-adhesive film 122 on the first surface 111.

The width of the overlapping area between the orthographic projection of the first sub-adhesive film 121 on the first surface 111 and the orthographic projection of the second sub-adhesive film 122 on the first surface 111 refers to, the distance w3 between two edges adjacent to each other in the orthogonal projection of the first sub-adhesive film 121 and the orthogonal projection of the second sub-adhesive film 122 in the extension direction of the long side of the long edge area 112. Under the condition that the width of the overlapping area of orthographic projections is too large, because the POE material of the second sub-adhesive film 122 has good fluidity, the POE material of the second sub-adhesive film 122 easily flows to the surface of the first sub-adhesive film 121 which is not covered originally, or even completely covers the surface of the first sub-adhesive film 121 far away from the first cover plate 101, to form POE film between the first sub-adhesive film 121 and the second adhesive film 104, resulting in forming the contact interface of different adhesive films in a large area in the edge area of photovoltaic module and reducing the bonding strength of adhesive films in the edge area of photovoltaic module. Under the condition that the width of the orthogonal projection overlapping area is too small, the total amount of the second sub-adhesive film 122 is small. Due to the good fluidity of the second sub-adhesive film 122, when the second sub-adhesive film 122 fills the gap between the central area of the first surface 111 and the cell string 103 in the lamination process, there may be a problem of glue shortage or a large number of bubbles, which may further affect the quality of the encapsulation film and the quality of photovoltaic modules.

Therefore, in the process of laying the first sub-adhesive film 121 and the second sub-adhesive film 122, the local overlapping width of the first sub-adhesive film 121 and the second sub-adhesive film 122 may be set, that is, in the extension direction of the long side of the long edge area 112, the width of the overlapping area of the orthographic projection of the first sub-adhesive film 121 on the first surface 111 and the orthographic projection of the second sub-adhesive film 122 on the first surface 111 may be set within the range of 5 mm to 12 mm. For example, it is set to 5.25 mm. 5.5 mm, 6 mm, 6.5 mm, 7.5 mm, 8.5 mm, 10 mm or 11.25 mm, etc. By setting the width of the overlapping part of the first sub-adhesive film 121 and the second sub-adhesive film 122 in an appropriate range, the area of the contact interface where different adhesive films contact in the edge area of the photovoltaic module after lamination can be reduced, and the bonding strength of the adhesive films in the edge area of the photovoltaic module can be improved. Moreover, such arrangement can avoid a large number of bubbles or glue-lacking areas in the encapsulation film of photovoltaic module, and improve the quality of encapsulation film and photovoltaic module.

In some embodiments, the distance between the edge of the cell string 103 and the edge of the second sub-adhesive film 122 is in a range of 10 mm to 15 mm in the extension direction of the long side of the long edge area 112.

The distance between the edge of the cell string 103 and the edge of the second sub-adhesive film 122 refers to the distance w4 between the edge of the outermost cell of the cell string 103 and the adjacent edge of the second sub-adhesive film 122 in the extension direction of the long side of the long edge area 112. The main function of the second sub-adhesive film 122 is to fill the gap between the central area of the first surface 111 and the cell string 103, and improve the anti-PID effect of the photovoltaic module. In the case of a large gap between the edge of the cell string 103 and the edge of the second sub-adhesive film 122, the size of the cell string 103 is much smaller than the size of the second sub-adhesive film 122, then the ratio between the area of the orthogonal projection of the cell string 103 on the first surface 111 and the area of the first surface 111 is relatively low, and in the photovoltaic module formed after lamination, the absorption rate of the cell string 103 to the light irradiated on the photovoltaic module is low, and the photoelectric conversion efficiency of the photovoltaic module is poor. The size of the cell string 103 and the second sub-adhesive film 122 refer to the area of the orthogonal projection of the cell string 103 and the second sub-adhesive film 122 on the first surface 111, respectively.

If the distance between the edge of the orthogonal projection of the second sub-adhesive film 122 on the first surface 111 and the edge of the first surface 111 is too small, since both the first sub-adhesive film 121 and the second sub-adhesive film 122 have fluidity in the laminating process, the light receiving surface of the cell string 103 may contact with other materials except the POE material in the second sub-adhesive film 122, which can lead to the decline of the anti-PID effect of the photovoltaic module and affect the reliability of the photovoltaic module.

Therefore, in the process of setting the second sub-adhesive film 122 and the cell string 103, the distance between the edge of the cell string 103 and the edge of the second sub-adhesive film 122, that is, the distance between the edge of the outermost cell of the cell string 103 and the adjacent edge of the second sub-adhesive film 122 in the extension direction of the long side of the long edge area 112, is set in the range of 10 mm to 15 mm. For example, it is set to 10.25 mm, 10.5 mm, 10.75 mm, 11 mm, 11.5 mm, 12.5 mm, 13.75 mm or 14.5 mm, etc. The distance between the edge of the cell string 103 and the edge of the second sub-adhesive film 122 is set in an appropriate range, so that the absorption rate of the cell string 103 to the light irradiated on the photovoltaic module can be improved, and the photoelectric conversion efficiency of the photovoltaic module can further be improved. Meanwhile, the light receiving surface of the cell string 103 can be prevented from contacting with adhesive films other than POE materials, so that the anti-PID effect of the photovoltaic module can be improved and the reliability of the photovoltaic module can be increased.

In some embodiments, the material of the portion of the first sub-adhesive film 121 facing the second cover plate 105 is EVA, PVB or POE.

The material of the first sub adhesive film 121 is usually selected based on the material of the part of the second adhesive film 104 facing the first cover plate 101. In case that the photovoltaic module is a single glass module, the second adhesive film 104 usually plays the main functions of adhering the second cover plate 105 and preventing moisture. In case that the photovoltaic module is a single glass module, the rear surface of the cell string 103 may directly contact with the adhesive film outside the POE material. In order to reduce the overall cost of photovoltaic modules, the second adhesive film 104 may be selected as a single-layer EVA adhesive film or PVB adhesive film to improve the waterproof and weather resistance of photovoltaic modules. The material of the part of the first sub-adhesive film 121 facing the second cover plate 105 may be the same EVA material or PVB material as the second adhesive film 104.

In case that the photovoltaic module is a double-glass module, the anti-PID effect on the rear surface of the cell string 103 is usually considered. Usually, a single-layer POE film or a composite film with POE material facing the cell string 103 is selected as the second adhesive film 104, so as to further improve the anti-PID effect of the photovoltaic module on the basis of ensuring the waterproof and weather resistance of the photovoltaic module. The material of the part of the first sub-adhesive film 121 facing the second cover plate 105 may be set as POE material.

In some embodiments, the first sub-adhesive film 121 includes a first adhesive film layer 210 and a second adhesive film layer 211 stacked in sequence, the first adhesive film layer 210 faces the second cover plate 105, and the material of the first adhesive film layer 210 is the same as the material of the part of the second adhesive film 104 facing the first cover plate 101.

Before the first sub-adhesive film 121 is laid, the first adhesive film layer 210 and the second adhesive film layer 211 which are sequentially stacked may be selected, and the material of the first adhesive film layer 210 facing the second cover plate 105 is the same as the material of the part of the second adhesive film 104 facing the first cover plate 101. A composite adhesive film is used as the first sub-adhesive film 121, and the bonding strength between the adhesive films located on both sides of the cell string 103 in the lamination process can be improved through the first adhesive film layer 210. The second adhesive film layer 211 may be set as a specific type of adhesive film according to other functional requirements. For example, a moisture detection film layer doped with water-absorbing color-changing particles or a sealing film layer with improved crosslinking degree after water absorption, which can improve the bonding strength of adhesive films in the edge area of photovoltaic modules while expanding the practicality and functionality of photovoltaic modules.

It should be understood that the second adhesive film layer 211 may be a single adhesive film layer with a single function, or a multi-layer composite adhesive film layer formed by lamination of stacked multiple layers with different functions. For example, the entire adhesive film layer may be a moisture detection film layer, or may be composed of a moisture detection film layer and a sealing film layer which are stacked.

In some embodiments, the second sub-adhesive film 122 includes a POE adhesive film, a PE adhesive film including a part of POE facing the cell string 103 or a PEP adhesive film.

The second sub-adhesive film 122 may also have a structure similar to the structure of the first sub-adhesive film 121. The second sub-adhesive film 122 may be a POE adhesive film completely made of POE, or may be a multi-layered composite adhesive film layer formed by lamination of stacked multiple layers and including an adhesive film layer of POE facing the cell string 103, for example, a PE adhesive film including a part of POE facing the cell string 103 or a PEP adhesive film. According to the functional requirements, a composite film including a part of POE facing the cell string 103 or a POE adhesive film made of POE as a whole is selected as the second sub-adhesive film 122, which can effectively improve the anti-PID effect of photovoltaic modules and improve the reliability of photovoltaic modules.

In some embodiments, the second adhesive film 104 includes a third adhesive film layer 410 and a fourth adhesive film layer 411 which are sequentially stacked, the third adhesive film layer 410 faces the first cover plate 101, and the material of the third adhesive film layer 410 is the same as the material of the part of the first sub-adhesive film 121 facing the second cover plate 105.

The main function of the second adhesive film 104 is to provide moisture resistance and aging resistance of photovoltaic modules, and the aging resistance under hot and humid conditions is affected by the bonding strength of the adhesive films on both sides of the cell string 103. Therefore, in the process of laying the second adhesive film 104, a single-layer adhesive film made of the same material may be selected as the second adhesive film 104 according to the requirements of function and cost. In addition, it is only necessary to ensure that the selected material is the same as the material of the part of the first sub-adhesive film 121 facing the second cover plate 105. For example, POE adhesive film, EVA adhesive film or PVB adhesive film is selected as the second adhesive film 104.

In case that there are other functional requirements for the second adhesive film 104, the second adhesive film 104 may be composed of a third adhesive film layer 410 and a fourth adhesive film layer 411 which are stacked. The third adhesive film layer 410 faces the first cover plate 101, and the material of the third adhesive film layer 410 is the same as the material of the part of the first sub-adhesive film 121 facing the second cover plate 105. Other functional requirements may be water absorption detection function or secondary sealing function, etc. The water absorption detection function may be realized by doping water-absorbing color-changing particles in the film layer, and the secondary packaging function may be realized by doping materials with increased crosslinking degree after water absorption in the film layer to construct the film layer. According to functional requirements, the second adhesive film 104 is arranged as two adhesive film layers which are stacked, and the material of the third adhesive film layer 410 facing the first cover plate 101 is the same as the material of the part of the first sub-adhesive film 121 facing the second cover plate 105. In this way, the bonding strength of the adhesive films in the edge area of the photovoltaic module can be improved, and the functions and application scenarios of the photovoltaic module can be expanded.

In some embodiments, the second adhesive film 104 includes a third sub-adhesive film 141 and a fourth sub-adhesive film 142 stacked in sequence, the second surface 151 of the second cover plate 105 facing the cell string 103 includes a central area and an edge area surrounding the central area, the third sub-adhesive film 141 is located on at least part of the edge area of the second surface 151, the fourth sub-adhesive film 142 is located on the surface of the third sub-adhesive film 141 far away from the second surface 151, and the orthographic projection of the first sub-adhesive film 121 on the first cover plate 101 and the orthographic projection of the third sub-adhesive film 141 on the first cover plate 101 at least partially overlap, the material of the part of the third sub-adhesive film 141 facing the first cover plate 101 is the same as the material of the part of the first sub-adhesive film 121 facing the second cover plate 105.

In the process of laying the second adhesive film 104, similar to the laying of the first adhesive film 102, the second adhesive film 104 may also be arranged to be composed of a third sub-adhesive film 141 and a fourth sub-adhesive film 142 which are stacked. The second surface 151 of the second cover plate 105 facing the cell string 103 is similar to the first surface 111 of the first cover plate 101, the positional relationship between the third sub-adhesive film 141 and the second surface 151 is similar to the positional relationship between the first sub-adhesive film 121 and the first surface 111. The relationship between the fourth sub-adhesive film 142, the third sub-adhesive film 141, and the second surface 151 is similar to the relationship between the second sub-adhesive film 122, the first sub-adhesive film 121, and the first surface 111, and is not repeated here.

The third sub-adhesive film 141 and the first sub-adhesive film 121 are located in the edge area of the second surface 151 and the edge area of the first surface 111, respectively. The third sub-adhesive film 141 is arranged at a specific position so that the orthographic projection of the third sub-adhesive film 141 on the first surface 111 is at least partially duplicated with the orthographic projection of the first sub-adhesive film 121 on the first surface 111. The material of the part of the first sub-adhesive film 121 facing the second cover plate 105 is the same as the material of the part of the third sub-adhesive film 141 facing the first cover plate 101, which ensures that the adhesive films located on both sides of the cell string 103 form contact interfaces with the same materials in the edge area of the photovoltaic module during the lamination process, increases the bonding strength of adhesive films in the edge area of the photovoltaic module, and reduces the probability of degumming of the photovoltaic module.

In addition, the second adhesive film 104 is designed to be composed of a third sub-adhesive film 141 and a fourth sub-adhesive film 142 stacked. In case that the photovoltaic module is a single glass module, a lower-cost adhesive film layer may be selected as the fourth sub-adhesive film 142 to construct the second adhesive film 104, thus reducing the overall cost of the photovoltaic module.

To sum up, according to the photovoltaic module provided by the embodiments of the present disclosure, the first sub-adhesive film 121 located is arranged on at least part of the edge area of the first surface of the first cover plate 101 adjacent to the light receiving surface of the cell string 103, and the material of the part of the first sub-adhesive film 121 facing the second cover plate 105 is the same as the material of the part of the second adhesive film 104 facing the first cover plate 101, and the second sub-adhesive film 122 is staked on the surface of the first sub-adhesive film 121 away from the first cover plate 101, the orthographic projection of the second sub-adhesive film 122 on the first surface 111 at least covers the center area and at least part of the edge area of the first surface 111, and the material of the part of the second sub-adhesive film 122 facing the cell string 103 is POE. The materials of the parts of the first sub-adhesive film 121 and the second adhesive film 104 facing each other are set to be the same material, so that the adhesive films located at the opposite sides of the cell string 103 form contact interfaces of the same material in the edge area during the lamination process of the photovoltaic module, thereby improving the bonding strength of the encapsulation film formed after lamination in the edge area, reducing the probability of edge delamination or degumming of photovoltaic modules. Besides, the part of the second sub-adhesive film 122 facing the cell string 103 is made of POE, which greatly reduces the PID effect of the photovoltaic module and improves the reliability and stability of the photovoltaic module.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

Persons of skills in the art may understand that the above embodiments are only specific embodiments of the present disclosure. In practical applications, various changes may be made in form and details without departing from the spirit and scope of the present disclosure. Persons skilled in the art may make various changes and modifications without departing from the scope of protection of the present disclosure. Thus, the scope of protection of the present disclosure shall be indicated by the appended claims.

What is claimed is:

1. A photovoltaic module, comprising: a first cover plate, a first adhesive film, a cell string, a second adhesive film and a second cover plate sequentially stacked in the afore-recited order;

wherein the cell string has a front side and an opposing rear side, the front side having a light receiving surface, wherein the first cover plate is disposed on the front side of the cell string and has a first surface facing the light receiving surface of the cell string, the first surface including a central area and an edge area surrounding the central area;

wherein the first adhesive film includes a first sub-adhesive film and a second sub-adhesive film, the first sub-adhesive film is located on the edge area and not on the central area of the first surface, the second sub-adhesive film is located on a surface of the first sub-adhesive film facing the cell string, and an orthographic projection of the second sub-adhesive film on the first surface at least covers the central area and part of the edge area of the first surface; and wherein the first sub-adhesive film is made of a same material as the second adhesive film, and a material of the second sub-adhesive film is Poly Olefin Elastomer (POE).

2. The photovoltaic module according to claim 1, wherein the first surface is rectangular, and the edge area includes two opposite long edge areas and two opposite short edge areas, an area where one of the two opposite long edge areas and one of the two opposite short edge areas overlap forms a corner area;
wherein the first sub-adhesive film covers at least one corner area in the edge area of the first surface.

3. The photovoltaic module according to claim 2, wherein the first sub-adhesive film at least covers the two opposite short edge areas.

4. The photovoltaic module according to claim 2, wherein a width of the first sub-adhesive film is in a range of 10 mm to 70 mm in an extension direction of long sides of the two opposite long edge areas.

5. The photovoltaic module according to claim 2, wherein in an extension direction of long sides of the two opposite long edge areas, a distance between an edge of the orthographic projection of the second sub-adhesive film on the first surface and an adjacent edge of the first surface is in a range of 10 mm to 20 mm.

6. The photovoltaic module according to claim 2, wherein in an extension direction of long sides of the two opposite long edge areas, a width of an overlapping area of the orthographic projection of the first sub-adhesive film on the first surface and the orthographic projection of the second sub-adhesive film on the first surface is in a range of 5 mm to 12 mm.

7. The photovoltaic module according to claim 2, wherein in an extension direction of long sides of the two opposite long edge areas, a distance between an edge of the cell string and an adjacent edge of the second sub adhesive film is in a range of 10 mm to 15 mm.

8. The photovoltaic module according to claim 1, wherein the material of the first sub-adhesive film is one of EVA, PVB and POE.

9. A photovoltaic module, comprising: a first cover plate, a first adhesive film, a cell string, a second adhesive film and a second cover plate sequentially stacked in the afore-recited order;
wherein the cell string has a front side and an opposing rear side, the front side having a light receiving surface, wherein the first cover plate is disposed on the front side of the cell string and has a first surface facing the light receiving surface of the cell string, the first surface including a central area and an edge area surrounding the central area;
wherein the first adhesive film includes a first sub-adhesive film and a second sub-adhesive film, the first sub-adhesive film is located on the edge area and not on the central area of the first surface, the second sub-adhesive film is located on a surface of the first sub-adhesive film facing the cell string, and an orthographic projection of the second sub-adhesive film on the first surface at least covers the central area and part of the edge area of the first surface;
wherein the first sub-adhesive film includes at least two layers, the second adhesive film includes at least two layers, and a material of one of the at least two layers of the first sub-adhesive film facing the cell string is the same as a material of one of the at least two layers of the second adhesive film facing the cell string; and
wherein the second sub-adhesive film has a multi-layered structure, and a material of a layer of the multi-layered structure adjacent to the cell string is Poly Olefin Elastomer (POE).

10. The photovoltaic module according to claim 9, wherein the at least two layers of the first sub-adhesive film includes a first adhesive film layer and a second adhesive film layer which are sequentially stacked, and the first adhesive film layer is adjacent to the second sub-adhesive film; the at least two layers of the second adhesive film include a third adhesive film layer and a fourth adhesive film layer which are sequentially stacked, and the third adhesive film layer is adjacent to the cell string; and a material of the first adhesive film layer is the same as a material of the third adhesive film layer.

11. The photovoltaic module according to claim 9, wherein the first surface is rectangular, and the edge area includes two opposite long edge areas and two opposite short edge areas, an area where one of the two opposite long edge areas and one of the two opposite short edge areas overlap forms a corner area;
wherein the first sub-adhesive film covers at least one corner area in the edge area of the first surface.

12. The photovoltaic module according to claim 9, wherein the first sub-adhesive film at least covers the two opposite short edge areas.

13. The photovoltaic module according to claim 9, wherein a width of the first sub-adhesive film is in a range of 10 mm to 70 mm in an extension direction of long sides of the two opposite long edge areas.

14. The photovoltaic module according to claim 9, wherein in an extension direction of long sides of the two opposite long edge areas, a distance between an edge of the orthographic projection of the second sub-adhesive film on the first surface and an adjacent edge of the first surface is in a range of 10 mm to 20 mm.

15. The photovoltaic module according to claim 9, wherein in an extension direction of long sides of the two opposite long edge areas, a width of an overlapping area of the orthographic projection of the first sub-adhesive film on the first surface and the orthographic projection of the second sub-adhesive film on the first surface is in a range of 5 mm to 12 mm.

16. The photovoltaic module according to claim 9, wherein in an extension direction of long sides of the two opposite long edge areas, a distance between an edge of the cell string and an adjacent edge of the second sub adhesive film is in a range of 10 mm to 15 mm.

* * * * *